(12) United States Patent
Ozawa

(10) Patent No.: US 8,125,232 B2
(45) Date of Patent: Feb. 28, 2012

(54) CAPACITIVE SENSING DEVICE AND METHOD

(75) Inventor: Naofumi Ozawa, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 345 days.

(21) Appl. No.: 12/382,724

(22) Filed: Mar. 23, 2009

(65) Prior Publication Data

US 2009/0243632 A1   Oct. 1, 2009

(30) Foreign Application Priority Data

Mar. 27, 2008   (JP) ................................. 2008/83733

(51) Int. Cl.
*G01R 27/26* (2006.01)

(52) U.S. Cl. ........................ 324/679; 345/173; 345/174

(58) Field of Classification Search .................... 324/679
See application file for complete search history.

(56) References Cited

U.S. PATENT DOCUMENTS

| | | | | |
|---|---|---|---|---|
| 4,459,541 | A * | 7/1984 | Fielden et al. | 324/678 |
| 4,642,555 | A * | 2/1987 | Swartz et al. | 324/677 |
| 5,825,351 | A * | 10/1998 | Tam | 345/173 |
| 6,225,711 | B1 * | 5/2001 | Gupta et al. | 307/125 |
| 6,989,677 | B2 * | 1/2006 | Morimoto | 324/660 |
| 7,256,589 | B2 * | 8/2007 | Andrade | 324/687 |
| 7,830,157 | B2 * | 11/2010 | Geaghan | 324/678 |
| 2003/0185048 | A1 * | 10/2003 | Fricke et al. | 365/170 |
| 2005/0162408 | A1 * | 7/2005 | Martchovsky | 345/173 |
| 2007/0171691 | A1 * | 7/2007 | Ashizawa | 365/96 |
| 2007/0188518 | A1 * | 8/2007 | Vale et al. | 345/619 |
| 2008/0106525 | A1 * | 5/2008 | Orr et al. | 345/174 |
| 2008/0136784 | A1 * | 6/2008 | Neoh et al. | 345/173 |
| 2009/0045821 | A1 * | 2/2009 | Liao et al. | 324/679 |
| 2009/0224776 | A1 * | 9/2009 | Keith | 324/686 |

OTHER PUBLICATIONS

"Cypress's CapSense Approximation Algorithm" Cypress Semiconductor Cooperation, Jan. 17, 2006, pp. 1-6.

* cited by examiner

*Primary Examiner* — Timothy J Dole
*Assistant Examiner* — Benjamin M Baldridge
(74) *Attorney, Agent, or Firm* — McGinn IP Law Group, PLLC

(57) ABSTRACT

In a capacitive sensing device for detecting a change in capacitance of an electrode which is caused by contact with a human body, the improvement of determination speed may be enabled. M (m is an integer satisfying $n \geq m \geq 2$) electrodes are selected from n (n is an integer equal to or larger than two) electrodes. Capacitors connected to the m electrodes are discharged in parallel during a predetermined period, and then charged. During the charging period, a potential of each of the m electrodes is compared with a reference potential. A difference between capacitance values of the capacitors connected to the m electrodes is determined based on a result obtained by the comparison between the m electrodes.

20 Claims, 14 Drawing Sheets

CAPACITIVE SENSING DEVICE AND METHOD

BACKGROUND OF THE INVENTION

1. Field of the Invention

The present invention relates to a capacitive sensing device and method, and more particularly, to a capacitive sensing device and method for sensing a change in capacitance which is caused by contact with a human body.

2. Description of the Related Art

In recent years, touch sensors for sensing contact with a human body based on a change in capacitance of an electrode are becoming widely popular. For example, the touch sensors are used for, for example, a mobile telephone, a digital music player, and a portable electronic device. The devices need to be driven with a battery, and hence a reduction in power consumption is desired. However, when the change in capacitance is to be sensed, it is normally necessary to charge and discharge a capacitor. Therefore, the measurement takes a certain time, thereby consuming power. Thus, it is necessary for the devices to minimize a time required to sense the change in capacitance in the touch sensors.

A method of sensing a capacitance using a switched capacitor is described in "Cypress's CapSense Approximation Algorithm" (Cypress Semiconductor Cooperation). FIG. 14 illustrates a sensing circuit disclosed in "Cypress's CapSense Approximation Algorithm" (Cypress Semiconductor Cooperation). In FIG. 14, capacitors $C_{Mod}$ and $C_{Internal}$ are provided in the sensing circuit and a capacitor (capacitance) $C_X$ is for a measurement object. When a human body (finger) is located over the sensor, a value of the capacitor $C_X$ increases. The sensing circuit operates as follows. First, switches $\phi 1$ and $\phi 2$ are alternately turned on/off. That is, the capacitor $C_X$ operates as a switched capacitor. In this case, a resistance value of the capacitor $C_X$ is equal to R ($=1/(Fs \cdot C_X)$) (Fs: switching frequency of switches $\phi 1$ and $\phi 2$). When the human body (finger) is located over the sensor, the value of the capacitor $C_X$ increases, and hence the resistance value R reduces. Therefore, a charging time required to reach Vref (predetermined voltage value) in the case where the finger is not located over the sensor is different from a charging time required to reach Vref in the case where the finger is located over the sensor. A time required to charge the capacitor up to Vref is measured using a timer, whereby whether or not the finger is located over the sensor may be sensed.

A mobile telephone, a digital music player, and a portable electronic device for which the touch sensors are widely employed require a large number of switches (bottoms) as user interfaces, and hence the touch sensors are provided for the switches.

When the sensor disclosed in "Cypress's CapSense Approximation Algorithm" (Cypress Semiconductor Cooperation) is used for the large number of switch devices, measurement of capacitances corresponding to the number of switches is required, that is, n-time measurement is required in a case of n-channel switches. This means that discharging and charging of each of the capacitors $C_X$, $C_{Mod}$, and $C_{Internal}$ are performed n times and is a factor inhibiting the reduction in device power consumption.

SUMMARY

The present invention seeks to solve one or more the above problems, or to improve upon those problems at least in part.

In one embodiment, a capacitive sensing device according to the present invention includes: n (n is an integer equal to or larger than two) electrodes; a selection section for selecting m (m is an integer satisfying $n \geq m \geq 2$) electrodes from the n electrodes; a charging and discharging control section connected to the m electrodes, for controlling charging and discharging capacitors connected to the m electrodes to be performed in parallel; a comparison section connected to the m electrodes, for comparing a reference potential with a potential of each of the m electrodes during the charging performed by the charging and discharging control section, to generate comparison result signals associated with the m electrodes; and a determination section connected to the comparison section, for determining a difference between capacitance values of the capacitors connected to the m electrodes based on the comparison result signals associated with the m electrodes.

In the capacitive sensing device for sensing changes in capacitances of the electrodes which are caused by contact with the human body, the present invention is useful to improve a determination speed and to realize the reduction in device power consumption which is achieved by the improvement of the determination speed.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

Hereinafter, embodiments of the present invention are described with reference to the attached drawings.

First Embodiment

Figure 1:
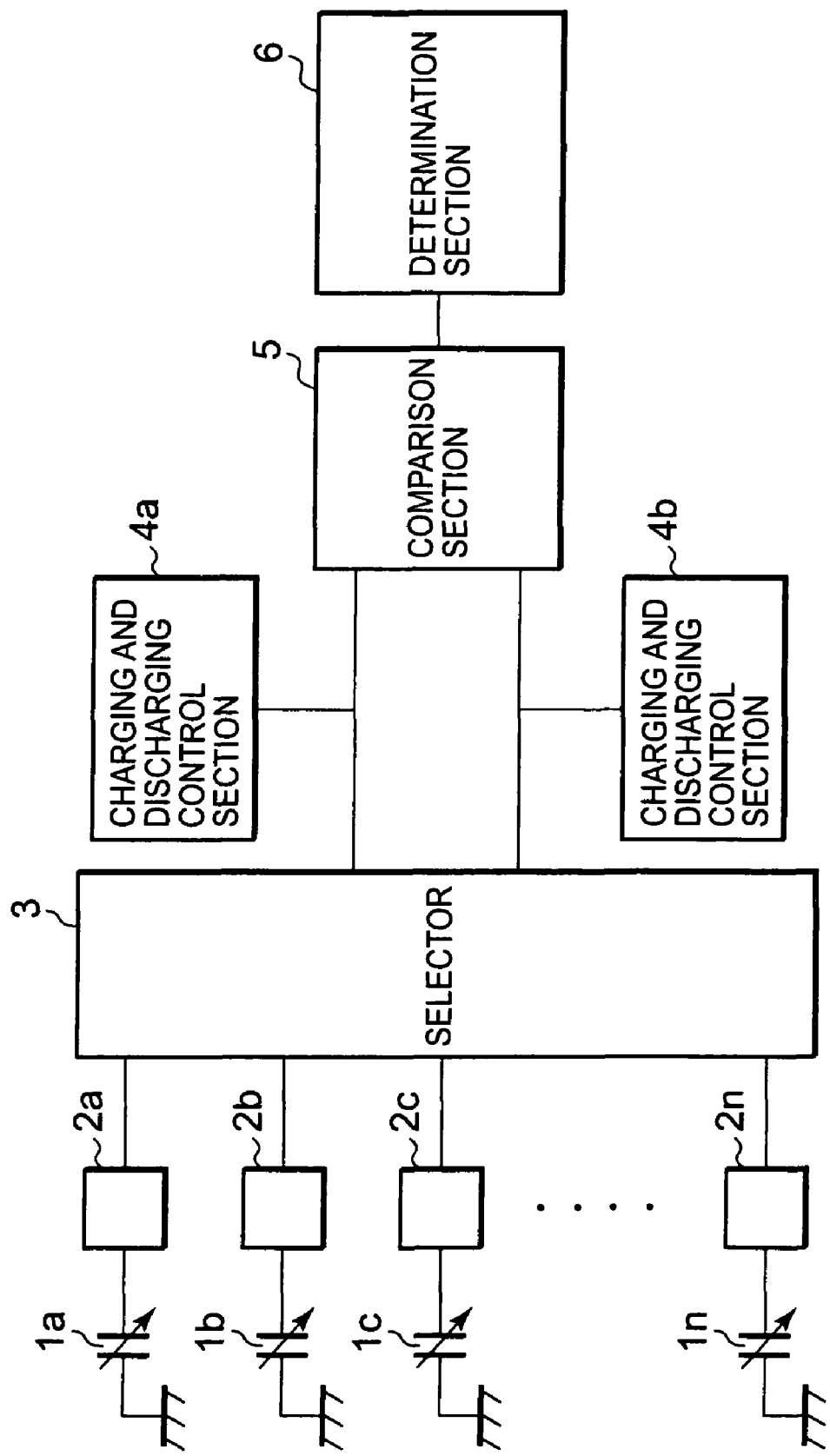
FIG. 1 is a general diagram illustrating a capacitive sensing device according to a first embodiment of the present invention.

FIG. 1 is a general explanatory diagram illustrating a concept of a capacitive sensing device according to a first embodiment of the present invention. The capacitive sensing device includes n channels (electrodes) 2a, 2b, ..., and 2n, capacitors 1a, 1b, ..., and 1n changed when a human body (finger) is in contact with electrodes, a selector 3, charging and discharging control sections 4a and 4b, a comparison section 5, and a determination section 6.

Figure 2:
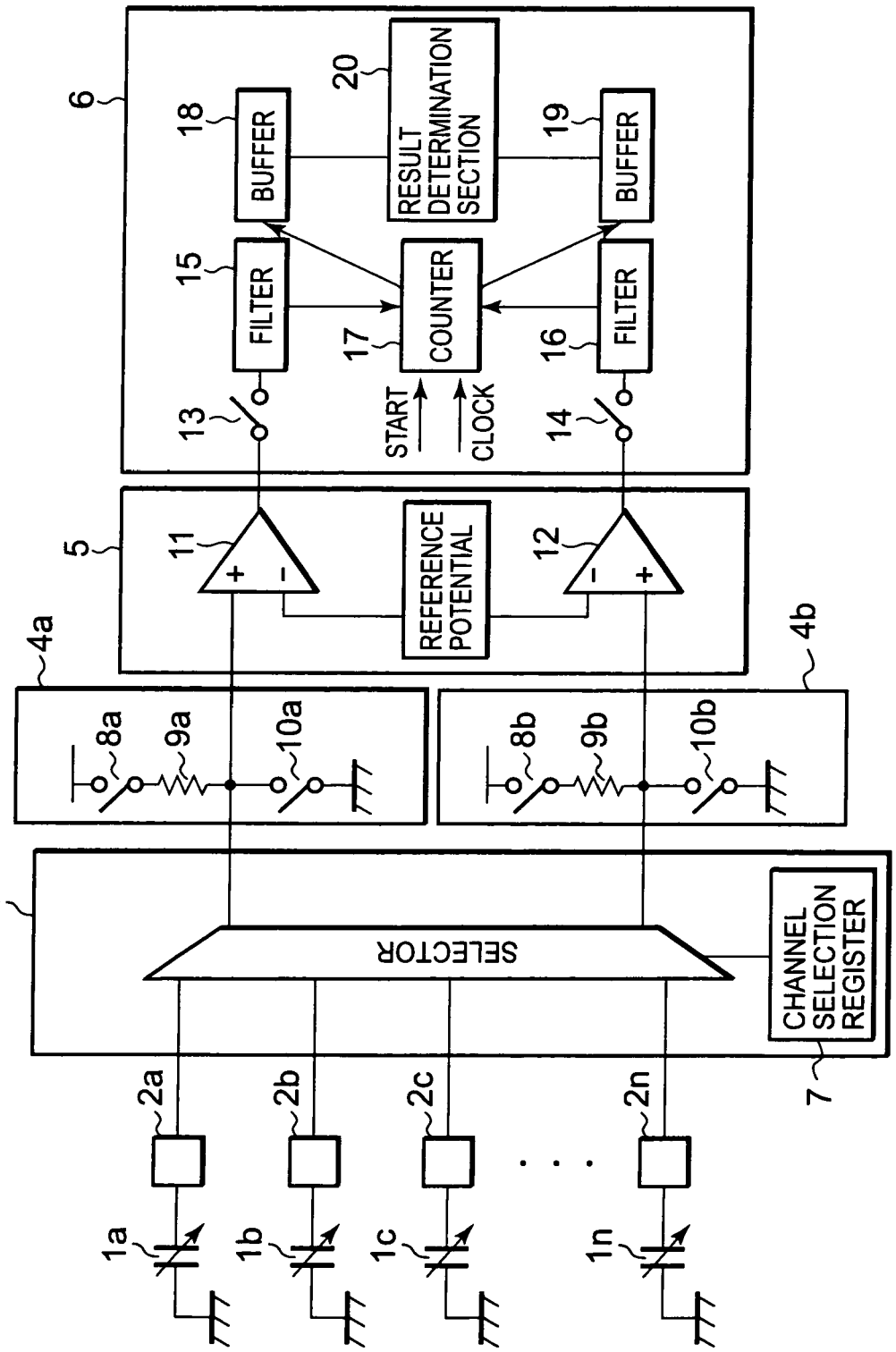
FIG. 2 is a detailed diagram illustrating the capacitive sensing device according to the first embodiment of the present invention.

FIG. 2 is a detailed diagram illustrating the capacitive sensing device. The selector 3 includes a channel selection register 7 for storing a value for selecting two channels of n input channels. The charging and discharging control section 4a (4b) includes a resistor element 9a (9b) and switches 8a and 10a (8b and 10b) for connecting the capacitors 1a to 1n with a power supply potential or a ground potential through the selector 3 to charge or discharge the capacitors 1a to 1n. The comparison section 5 includes comparators 11 and 12 for comparing potentials of the capacitors 1a to 1n connected there with through the selector 3 with a reference potential. The determination section 6 includes a counter 17 for counting from the start of charging to changing points of output values of the respective comparators 11 and 12, in response to the charging points serving as triggers, buffers (storage sections) 18 and 19 storing two count values of the counter 17, a result determination section 20 for determining a difference between capacitance values of two capacitors connected through the selector 3 based on the two count values, and filters 15 and 16 for stabilizing the output values of the comparators 11 and 12.

Figure 3:
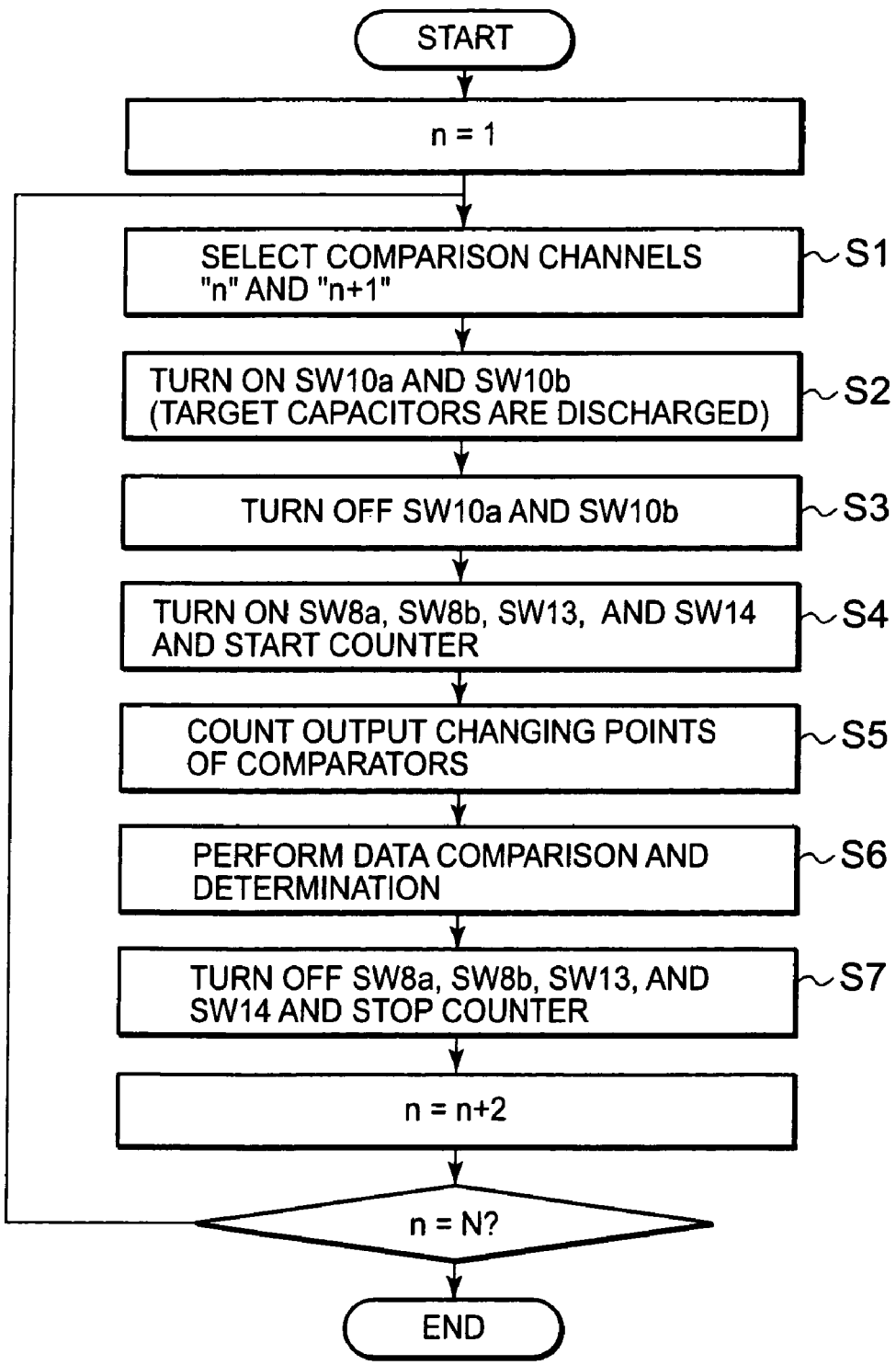
FIG. 3 is a flow chart illustrating an operation of the capacitive sensing device according to the first embodiment of the present invention.
Figure 4:
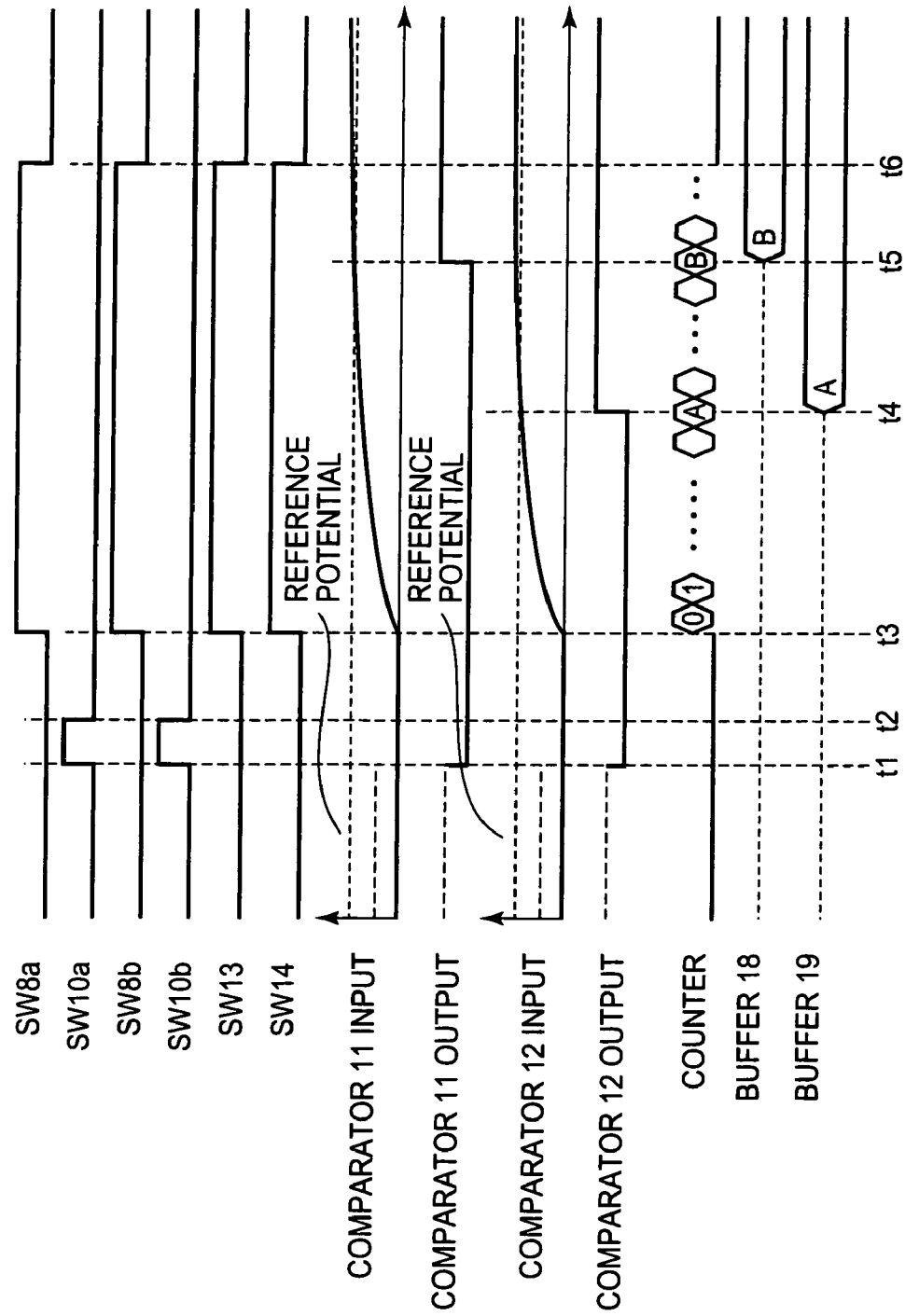
FIG. 4 is a timing chart illustrating the operation of the capacitive sensing device according to the first embodiment of the present invention.

An operation of the capacitive sensing device according to the first embodiment is described with reference to FIGS. 3 and 4. Two channels are selected from the n input channels by the selector 3 (Step S1). There may be various methods of selecting the two channels. Here, a method of selecting two channels without overlapping in a stated order from a channel located at an end, for example, selecting first and second channels, third and fourth channels, and one and its subsequent channels, is described. Therefore, a value for selecting the channels 2a and 2b is set to the channel selection register 7, and the channels 2a and 2b are selected by the selector 3. As a result of the selection, the channel 2a and the channel 2b are connected to the charging and discharging control section 4a and the charging and discharging control section 4b, respectively, through the selector 3.

At a time t1, the switches 10a and 10b of the charging and discharging control sections 4a and 4b are turned ON (Step S2). Then, the channels 2a and 2b are connected to the ground potential to discharge charges from the capacitors 1a and 1b connected to the channels 2a and 2b. After the discharging, at a time t2, the switches (SW) 10a and 10b are turned OFF (Step S3).

At a time t3, the switches 8a and 8b of the charging and discharging control sections 4a and 4b and the switches 13 and 14 of the determination section 6 are turned ON and a count operation of the counter 17 is started (Step S4). When the switches 8a and 8b are turned ON, the channels 2a and 2b are connected to the power supply potential through the resistors 9a and 9b to start to charge the capacitors 1a and 1b connected to the channels 2a and 2b. Potentials of the channels 2a and 2b change with time constants.

The comparator 11 (12) compares the potential of the channel 2a (2b) with the reference potential while the capacitor 1a (1b) connected to the channel 2a (2b) is being charged. When the potential thereof is lower than the reference potential, a low level Lo is output. When the potential thereof is higher than the reference potential, a high level Hi is output. The reference potential is set in advance and the detailed description thereof is made later. When the human body (finger) is in contact with a channel, a value of the capacitor connected to the channel is increased compared with a case where the human body is not in contact with the channel. Therefore, an increase in potential of the channel, which is caused by charging is slower than in the case where the human body is not in contact with the channel. FIG. 4 illustrates a case where the human body is in contact with the channel 2a. A change in potential of the channel 2a connected to the comparator 11 is slower than a change in potential of the channel 2b connected to the comparator 12. At a time t5 when the potential of the channel 2a exceeds the reference potential, the output of the comparator 11 is changed from the low level Lo to the high level Hi. At a time t4 when the potential of the channel 2b exceeds the reference potential, the output of the comparator 12 is changed from the low level Lo to the high level Hi.

When the potentials of the channels 2a and 2b are close to the reference potential, the outputs of the comparators 11 and 12 become unstable because of the influence of noise or the like. The filters 15 and 16 are provided for measures against such a problem. The influence of hysteresis also causes such a problem. For measures against noise in the comparators 11 and 12, generally known technologies are desirably used, and thus the detailed description thereof is omitted.

The counter 17 starts the count operation from the charging start time t3 and causes the buffer 18 or 19 to store a count value at a time when the output signal of any one of the comparators 11 and 12 changes (Step S5). In FIG. 4, the output of the comparator 12 is changed from the low level Lo to the high level Hi at the time t4, and hence a count value "A" at this time is stored in the buffer 19. Then, the output of the comparator 11 is changed from the low level Lo to the high level Hi at the time t5, and hence a count value "B" at this time is stored in the buffer 18.

The result determination section 20 determines the difference between the capacitance values of the capacitors connected to the two channels, that is, the channel which is in contact with the human body, based on the count values "A" and "B" stored in the buffers 18 and 19, and generates a result obtained by the determination (Step S6). As described above, the capacitance value of the capacitor connected to the channel which is in contact with the human body increases, and hence it takes a time before the potential of the channel reaches the reference potential. Therefore, the result determination section 20 compares the count values "A" and "B" with each other to determine the difference between capacitance values of the two capacitors. In the case of FIG. 4, the count value "B">the count value "A", and hence the capacitance value of the capacitor connected to the channel 2a having the count value "B" is larger and thus the channel 2a is determined as the channel which is contact with the human body. The buffers 18 and 19 are provided correspondingly to the comparators 11 and 12. The result determination section 20 references the value of the channel selection register 7 to recognize which of the channels 2a to 2n a determination target channel is and with which of the comparators 11 and 12 the determination target channel is connected. As a result, each of the count values "A" and "B" may be determined to correspond to which of the channels. The buffers 18 and 19 are not necessarily separated from each other as illustrated in FIG. 2 and may be assigned to divided regions (addresses) in the same storage device.

After the result is output from the result determination section 20, the switches 8a, 8b, 13, and 14 are turned OFF (Step S7). The respective Steps S1 to S7 described above are repeated for the remaining channels 2c to 2n to successively determine whether or not the human body is in contact with each of the channels.

Next, the reference potential is described. As described above, the reference potential is used to determine whether or not the human body is in contact with each of the channels. The reference potential is desirably a value equal to or smaller than the power supply potential of each of the charging and discharging control sections 4a and 4b, and may be set in advance based on a difference between the time t4 and the time t5, that is, a difference between changed channel potentials in the case where the human body is in contact with the channel and the case where the human body is not in contact with the channel, within a range in which the value may be sufficiently measured with the resolution of the counter 17.

In FIG. 2, the charging and discharging control sections 4a and 4b may be provided at the preceding stage of the selector 3. In this case, as illustrated in FIG. 5, the charging and discharging control sections are provided for each channel (only channels 2a and 2b are illustrated in FIG. 5).

Figure 5:
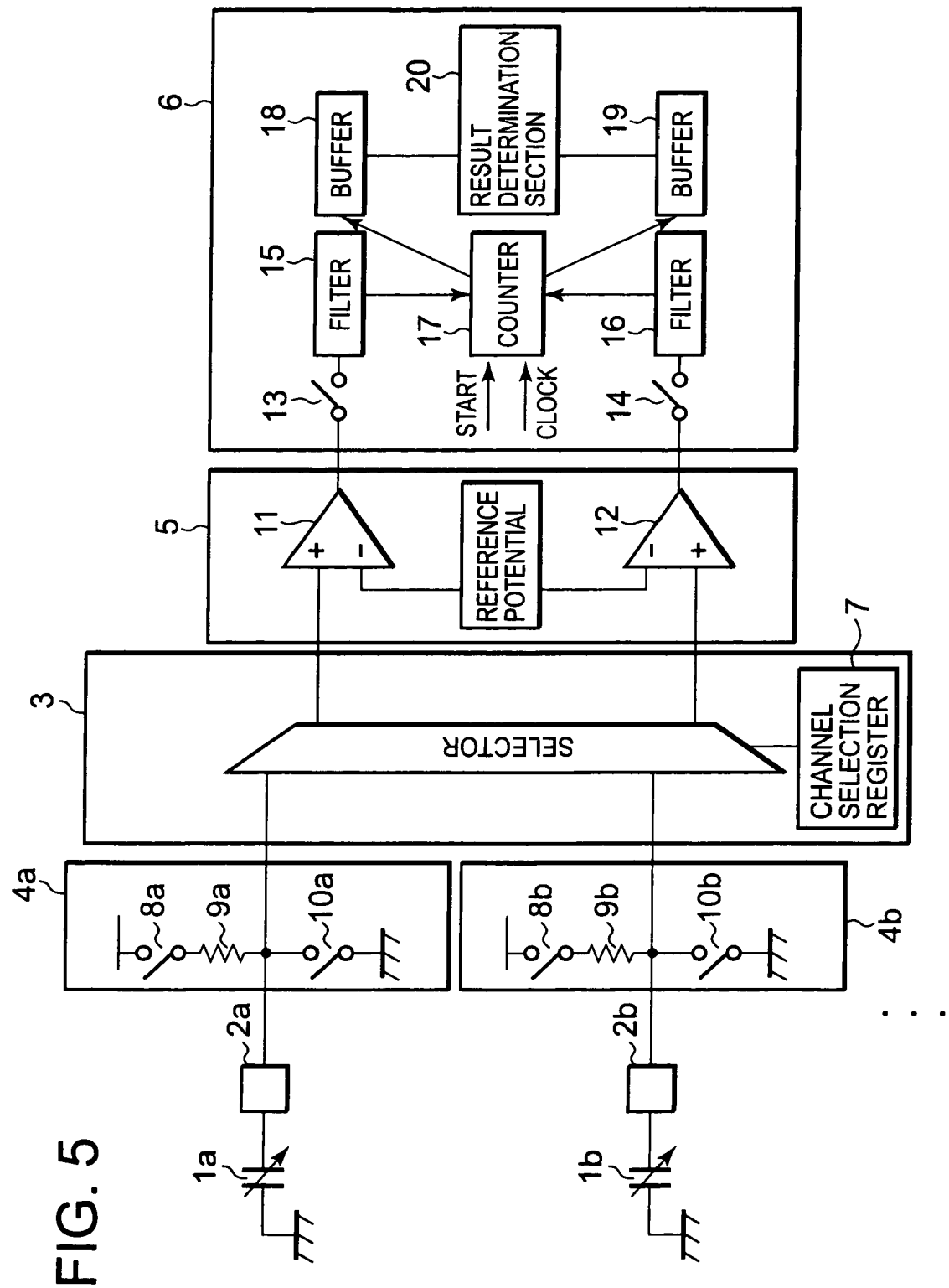
FIG. 5 illustrates a modified example of the capacitive sensing device according to the first embodiment of the present invention.

In FIG. 5, the selector 3, the switches 8a, 8b, 10a, 10b, 13, and 14, the charging and discharging control sections 4a and 4b, the comparator 5, the determination section 6, and respective switches may be controlled using a microcomputer and a control program. Hereinafter, such a structure is described with reference to FIG. 6.

Figure 6:
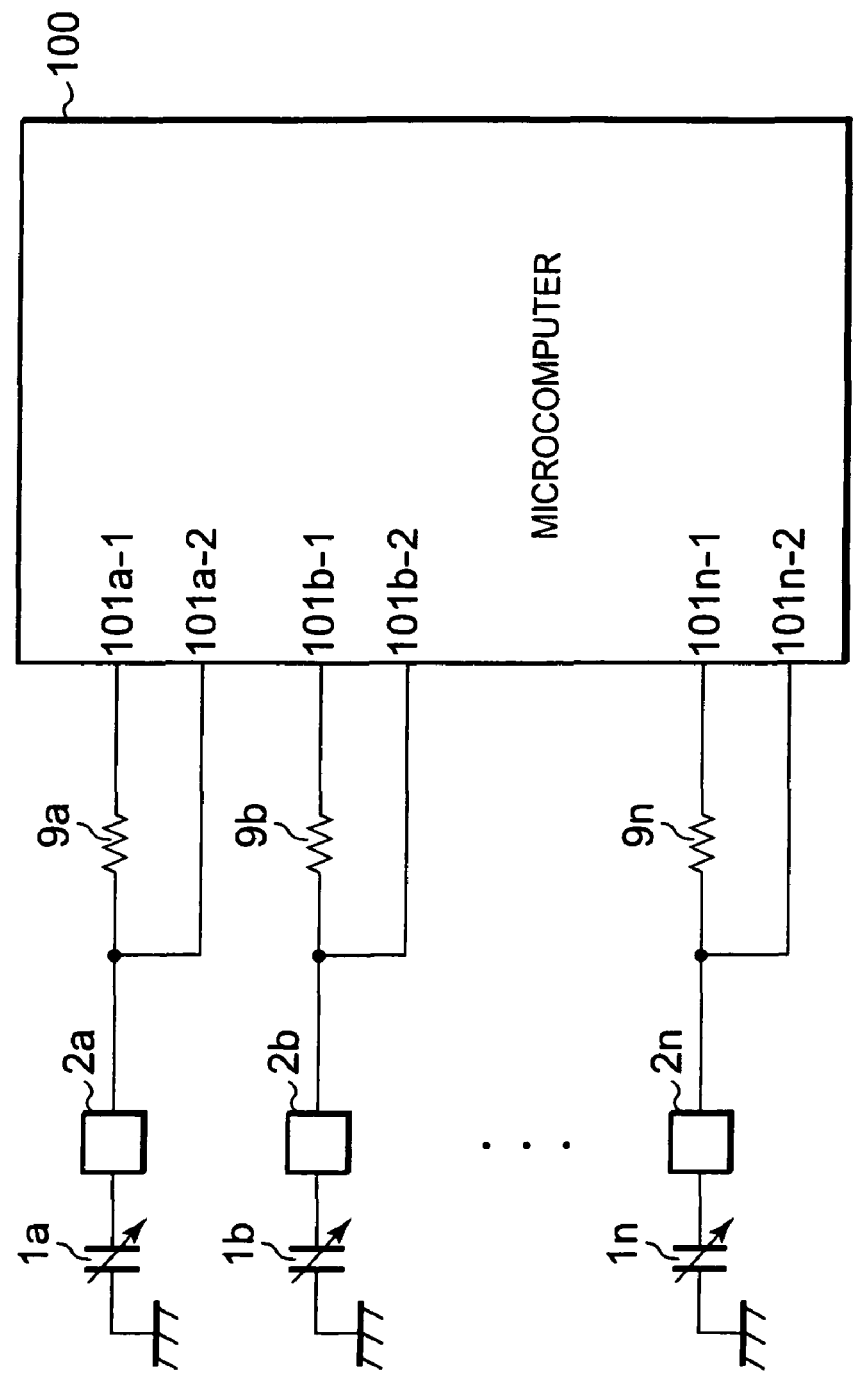
FIG. 6 illustrates a case where the capacitive sensing device according to the first embodiment of the present invention is realized using a microcomputer.

As illustrated in FIG. 6, a microcomputer 100 includes terminals 101a-1 to 101n-1 and 101a-2 to 101n-2. The terminals 101a-1 to 101n-1 are connected to the channels 2a to 2n through resistor elements 9a, 9b, . . . , 9n. The terminals 101a-2 to 101n-2 are connected to the channels 2a to 2n without passing through the resistor elements.

An operation of the microcomputer 100 is described with reference to FIG. 3. A value is set to the channel selection register 7 so as to select the electrodes 2a and 2b from the electrodes 2a to 2n (Step S1) and the terminals 101a-2 and 101b-2 are set to the ground potential between the times t1 and t2, thereby discharging the capacitors connected to the channels 2a and 2b (Step S2). Then, at the time t3, the supply of the ground potential to the terminals 101a-2 and 101b-2 is stopped and the terminals 101a-1 and 101b-1 are set to the power supply potential, thereby starting the charging of the capacitors connected to the channels 2a and 2b (Step S4).

Counting is performed from the start of charging of the capacitors connected to the channels 2a and 2b to a time when each of the potentials of the terminals 101a-1 and 101b-1 becomes the reference potential (Step S5), and a channel having a larger count value, that is, the channel 2a is determined to be a channel connected to a capacitor having a larger capacitance (Step S6). After the determination, the supply of the power supply potential to the terminals 101a-1 and 101b-1 and the counting are stopped (Step S7). The respective Steps S1 to S7 are repeated for the remaining channels to successively determine the capacitance value of the capacitor connected to each of the channels, that is, whether or not the human body is in contact with each of the channels.

As described above, according to this embodiment, the two channels are successively selected from the n channels and whether or not the human body is in contact with each of the channels is determined. Therefore, unlike the conventional technology which requires the n-time determination operations for the n channels, the determination for the n channels may be made by performing the determination operation n/2 times.

The result determination section 20 may be further provided with the following function. The following two values are measured in advance and stored in a storage section (not shown) included in the result determination section 20. A first value is a count value "C" obtained by counting until a potential of a channel becomes the reference potential (between t3 and t4) in the case where the human body is not in contact with the channel. A second value is a count value "D" obtained by counting until a potential of a channel becomes the reference potential (between t3 and t5) in the case where the human body is in contact with the channel. FIG. 4 illustrates the case where the human body is in contact with the channel 2a and the case where the human body is not in contact with the channel 2b, and hence the count values "C" and "D" are equal to the count values "A" and "B" of FIG. 4.

Next, an operation of the result determination section 20 using the two values stored in advance is described. FIG. 3 is not changed except for the data comparison and determination step (Step S6). The result determination section 20 further compares the count values "A" and "B" stored in the buffers 18 and 19 with the count values "C" and "D" measured in advance and performs the following determination.

$A, B = C$ . . . "none of two channels are in contact"

$A, B = D$ . . . "both two channels are in contact"

In view of error caused by, for example, a variation in temperature, the following determination may be made.

$C - a \leq A, B \leq C + a$ . . . "none of two channels are in contact"

$D - b \leq A, B \leq D + b$ . . . "both two channels are in contact"

where "a" and "b" denote a change in potential resulting from, for example, a variation in temperature, and a variation caused by, for example, an individual difference of the comparison section, respectively, and are also measured in advance.

As described above, according to this embodiment, it is possible to determine whether the human body is in contact with any one of the two channels, the human body is in contact with none of the two channels, or the human body is in contact with both the two channels.

In this embodiment described above, the two channels are selected from the n channels. However, the present invention is not limited to this case. Three or more channels may be selected. In such a case, comparators corresponding to the number of selected channels are required. However, the counter 17 and the result determination section 20 operate in the same manner as in the case of selecting the two channels.

Second Embodiment

Figure 7:
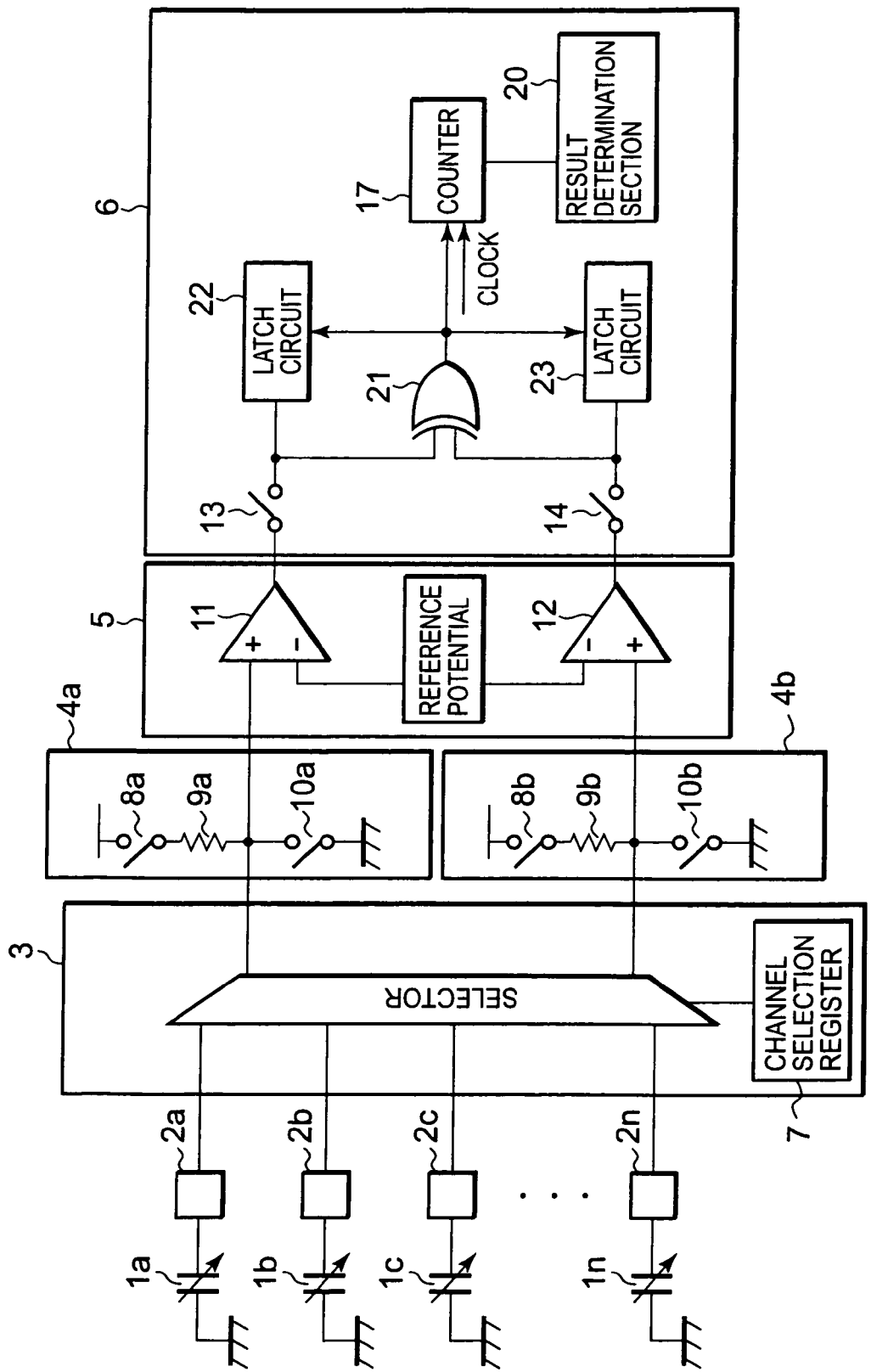
FIG. 7 is a detailed diagram illustrating a capacitive sensing device according to a second embodiment of the present invention.

FIG. 7 illustrates a capacitive sensing device according to a second embodiment of the present invention. The second embodiment is different from the first embodiment in that the determination section 6 includes the counter 17, an exclusive OR (XOR) circuit 21, and latch circuits (storage sections) 22 and 23. As in the first embodiment, the capacitive sensing device may be realized using the microcomputer and the control program as illustrated in FIG. 6 even in the second embodiment.

Figure 8:
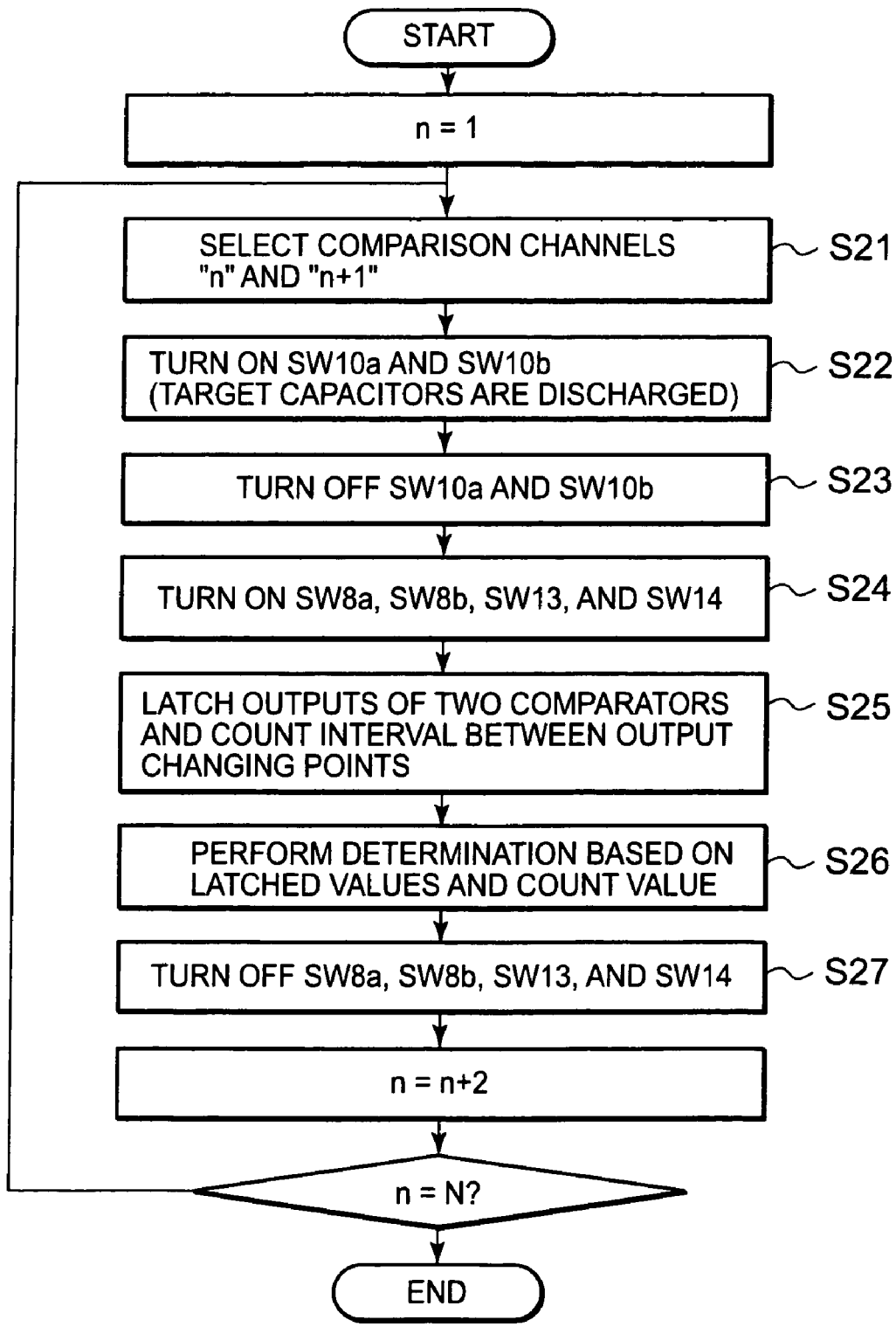
FIG. 8 is a flow chart illustrating an operation of the capacitive sensing device according to the second embodiment of the present invention.

Next, an operation of the capacitive sensing device according to the second embodiment is described with reference to FIGS. 7 to 9. Two channels (channels 2a and 2b) are selected from the n input channels by the selector 3 (Step S21). During the interval between the times t1 to t2, the switches 10a and 10b of the charging and discharging control sections 4a and 4b are kept ON (Steps S22 and S23). Then, the capacitors connected to the channels 2a and 2b are discharged.

At the time t3, the switches 8a and 8b of the charging and discharging control sections 4a and 4b and the switches 13 and 14 of the determination section 6 are turned ON (Step S24). Then, the channels 2a and 2b are connected to the power supply potential through the resistors 9a and 9b to start to charge the capacitors connected to the channels 2a and 2b.

The comparators 11 and 12 operate in the same manner as in the first embodiment. FIG. 9 illustrates the case where the human body is in contact with the channel 2a. The potential of the channel 2b which is not in contact with the human body exceeds the reference potential at the time t4, and hence the output of the comparator 12 is changed from the low level Lo to the high level Hi. The potential of the channel 2a which is in contact with the human body exceeds the reference potential at the time t5, and hence the output of the comparator 11 is changed from the low level Lo to the high level Hi. The XOR circuit 21 outputs the high level Hi when any one of the outputs of the comparators 11 and 12 becomes the high level Hi. That is, the output of the XOR circuit 21 becomes the high level Hi at the time t4 and the low level Lo at the time t5.

The latch circuits 22 and 23 and the counter 17 are subjected to value set and count control in response to an output of the XOR circuit 21 (Step S25). The latch circuits 22 and 23 latch the values of the comparators 11 and 12 in response to the high level Hi output from the XOR circuit 21, serving as a trigger. That is, at the time t4, the latch circuit 23 latches the high level Hi from the comparator 12 and the latch circuit 22 latches the low level Lo from the comparator 11. The counter 17 starts to count in response to the high level Hi output from the XOR circuit 21 at the time t4, and stops to count in response to the low level Lo output from the XOR circuit 21 at the time t5. That is, the counter 17 counts the interval between the times t4 and t5.

The result determination section 20 determines the channel which is in contact with the human body, based on the values latched by the latch circuits 22 and 23 and the count value of the counter 17 (Step S26). In the case of FIG. 9, the latch circuit 22 latches the low level Lo and the latch circuit 23 latches the high level Hi, and hence it is determined that the capacitance value of the capacitor connected to the channel 2a is larger and thus the channel 2a is in contact with the human body.

After the determination, the switches 8a, 8b, 13, and 14 are turned OFF (Step S27). The respective Steps S21 to S27 described above are repeated for the remaining channels 2c to 2n to successively determine whether or not the human body is in contact with each of the channels.

Figure 9:
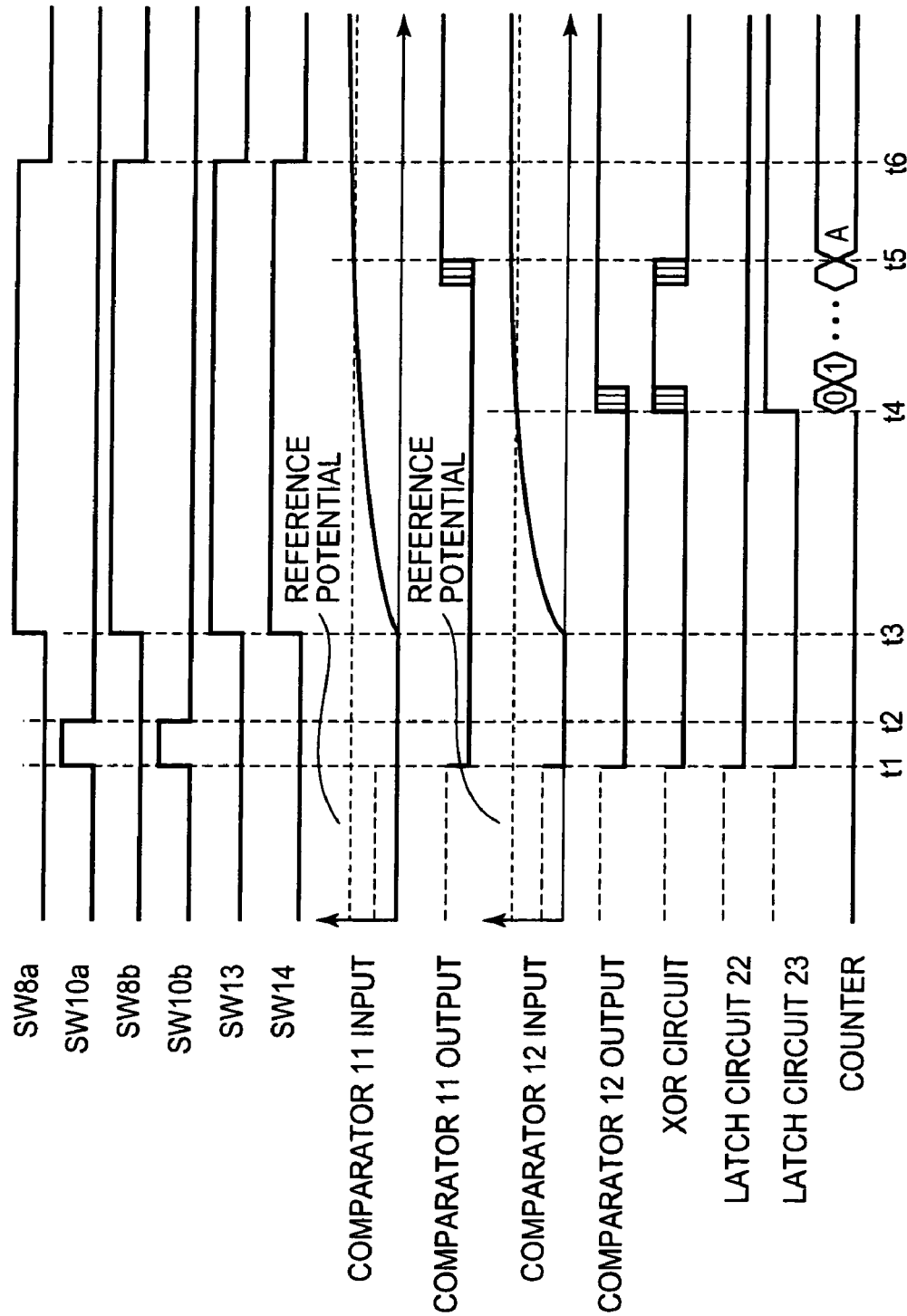
FIG. 9 is a timing chart illustrating the operation of the capacitive sensing device according to the second embodiment of the present invention.

Unlike the case of FIG. 9, when it is assumed that the human body is in contact with none of the channels 2a and 2b or the human body is in contact with both the channels 2a and 2b, the outputs of the comparators 11 and 12 change at substantially the same time close to the time t4 or t5. In this case, when a predetermined value is measured in advance and stored in a storage section (not shown) included in the result determination section 20, the determination may be made. Such a case is described below.

The predetermined value is a value "c" for determining that the human body is in contact with none of the channels or the human body is in contact with both the channels. In a case where there is not, for example, an error such as a variation in potential resulting from a change in temperature or an individual difference of the comparators, when the human body is in contact with none of the two channels or the human body is in contact with both the two channels, the outputs of the comparators 11 and 12 become the high level Hi at the same time, and hence the count value should become 0. However, in addition to the dependence on the resolution (operating frequency) of the counter 17, when there is an error, the count value does not necessarily become 0. Therefore, measurement allowing, for example, a change in temperature is performed to determine the value "c" for determining that the human body is in contact with none of the channels or the human body is in contact with none of the channels. Thus, the result determination section 20 may further make the following determination.

Count value $\leqq 0$ to $c$ ... "none of two channels are in contact or both two channels are in contact"

The following determination may be also made based on the count values "C" and "D" described in the first embodiment.

Count value=$(D-C)$ "human body is in contact with any one of two channels"

It is determined based on the values stored in the latch circuits with which of the two channels the human body is in contact, as described above.

When the values "a" and "b" described in the first embodiments are used, the expression described above may be changed to the following expression.

$(D-b)-(C+a)<$count value$<(D+b)-(C-a)$

According to the second embodiment, the determination for the n channels may be made by performing the determination operation n/2 times as in the first embodiment. The outputs of the comparators for the respective channels are obtained in response to a trigger when the potential of any one of the channels selected from the n channels becomes the reference potential. Therefore, the difference between the capacitance values of the capacitors connected to the respective channels may be determined before the potentials of all the selected channels become the reference potential, and hence higher-speed determination processing may be performed. In the first embodiment, the filters 15 and 16 are provided to remove noise from the comparators 11 and 12. However, according to the second embodiment, the output terminals of the comparators are connected to the XOR circuit 21 and the latch circuits 22 and 23, and hence the filters are unnecessary.

Third Embodiment

Figure 10:
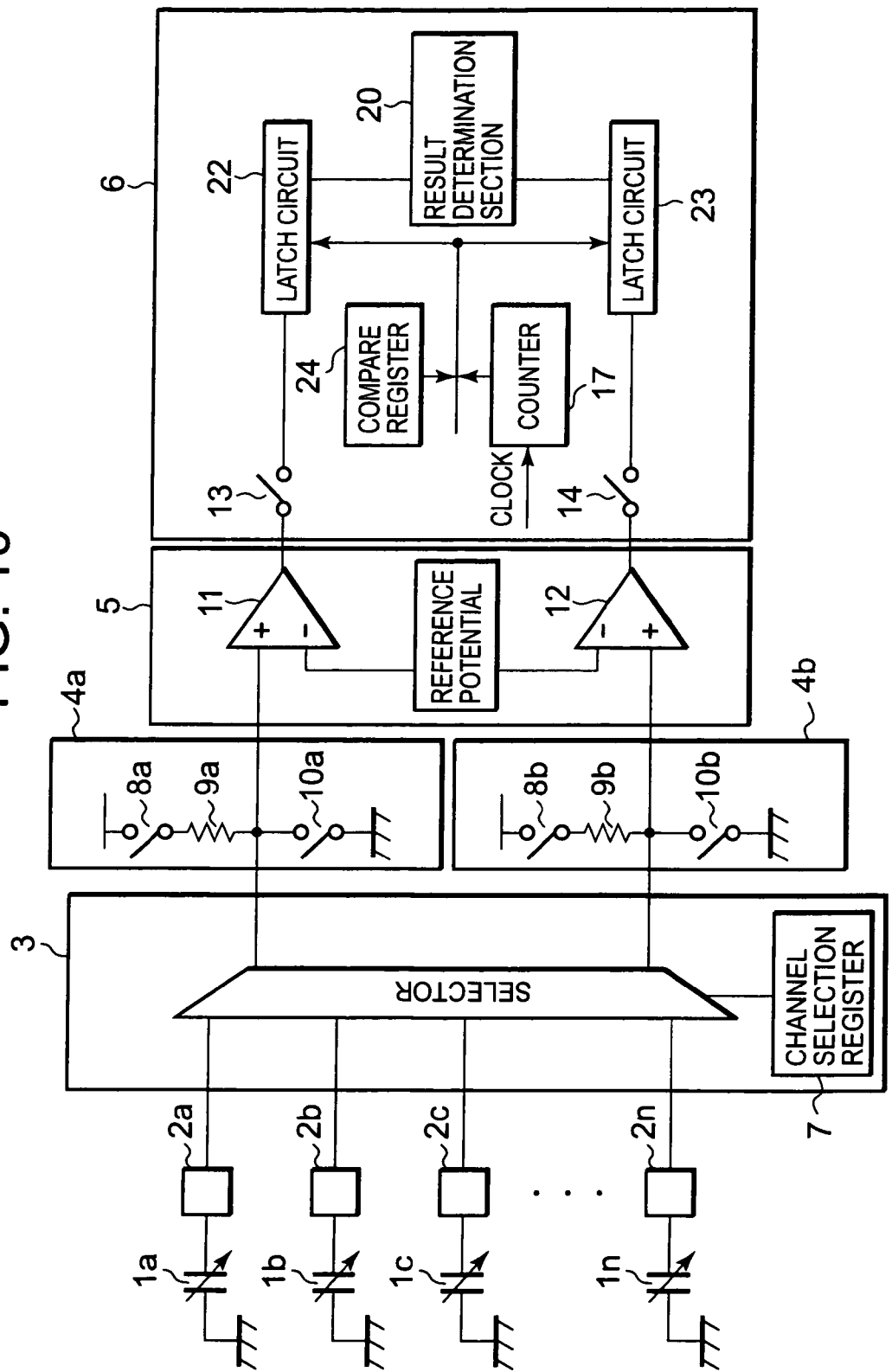
FIG. 10 is a detailed diagram illustrating a capacitive sensing device according to a third embodiment of the present invention.

FIG. 10 illustrates a capacitive sensing device according to a third embodiment of the present invention. The third embodiment is different from the first and second embodiments in that the determination section 6 includes the counter 17, the latch circuits (storage sections) 22 and 23, and a compare register 24. As in the first and second embodiments, the capacitive sensing device may be realized using the microcomputer and the control program as illustrated in FIG. 6 even in the third embodiment.

Figure 11:
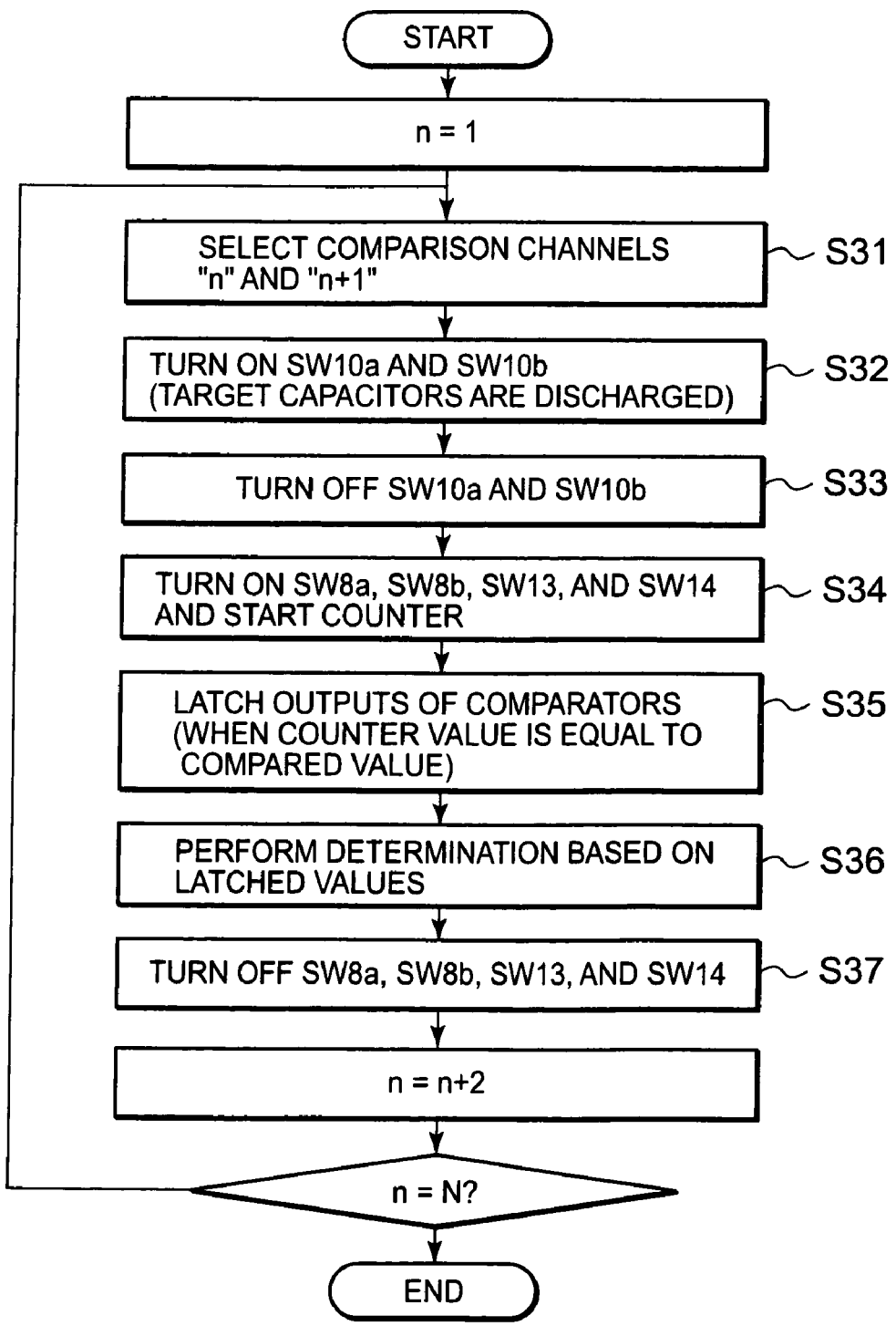
FIG. 11 is a flow chart illustrating an operation of the capacitive sensing device according to the third embodiment of the present invention.

Next, an operation of the capacitive sensing device according to the third embodiment is described with reference to FIGS. 10 to 12. Two channels (channels 2a and 2b) are selected from the n input channels by the selector 3 (Step S31). During the interval between the times t1 to t2, the switches 10a and 10b of the charging and discharging control sections 4a and 4b are kept ON (Steps S32 and S33). Then, the capacitors connected to the channels 2a and 2b are discharged.

At the time t3, the switches 8a and 8b of the charging and discharging control sections 4a and 4b and the switches 13 and 14 of the determination section 6 are turned ON and the counting of the counter 17 is started (Step S34). Then, the channels 2a and 2b are connected to the power supply potential through the resistors 9a and 9b to start to charge the capacitors connected to the channels 2a and 2b.

The comparators 11 and 12 operate in the same manner as in the first embodiment. FIG. 12 illustrates the case where the human body is in contact with the channel 2a. The potential of the channel 2b which is not in contact with the human body exceeds the reference potential at the time t4, and hence the output of the comparator 12 is changed from the low level Lo to the high level Hi. The potential of the channel 2a which is in contact with the human body exceeds the reference potential at the time t5, and hence the output of the comparator 11 is changed from the low level Lo to the high level Hi.

Figure 13:
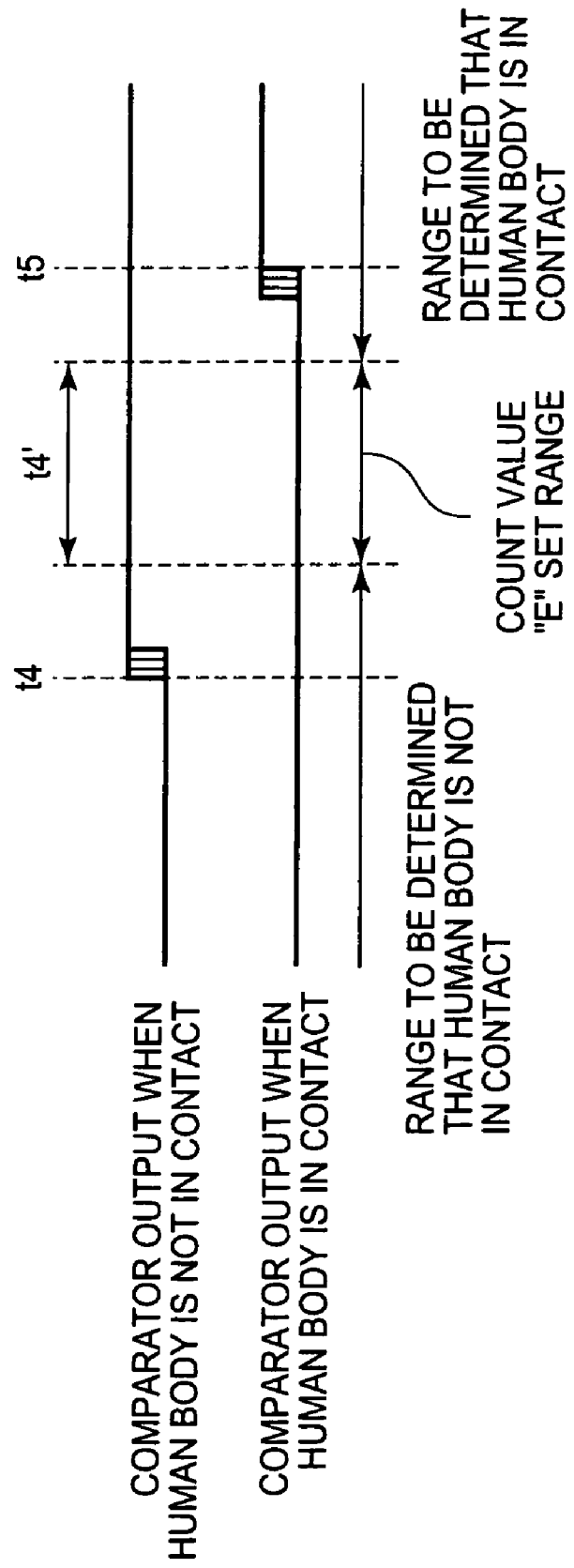
FIG. 13 is an explanatory diagram illustrating determination ranges in the third embodiment of the present invention.
Figure 14:
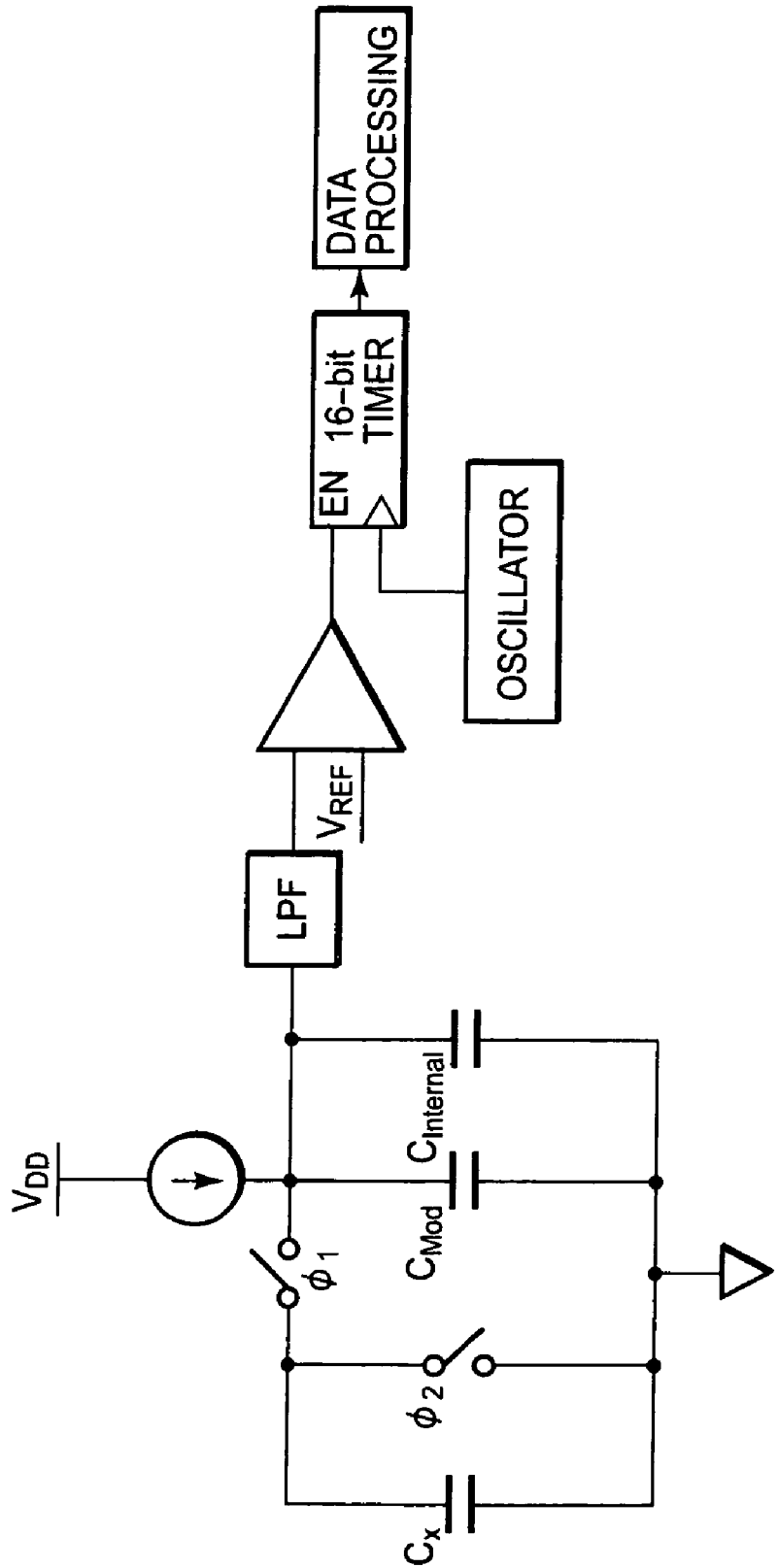
FIG. 14 illustrates a conventional technology.

The compare register 24 stores a count value "E" for determining whether or not the human body is in contact with channels. The count value "E" is obtained by measurement in advance. The count value "E" is set to a value between a value obtained by counting until a potential of a channel becomes the reference potential in the case where the human body is not in contact with the channel and a value obtained by counting until the potential of the channel becomes the reference potential in the case where the human body is in contact with the channel. The count value "E" is described with reference to FIG. 13. FIG. 13 illustrates the outputs of the comparators in the case where the human body is not in contact with electrodes and the case where the human body is in contact with an electrode. The outputs of the respective cases change in the vicinities of the times t4 and t5 at which potentials become the reference potential. A variation in potential resulting from a change in temperature, an individual difference of the comparators, and variations in outputs of the comparators which are caused by noise are taken into account, and hence a range (period) to be determined that the human body is not in contact and a range (period) to be determined that the human body is in contact are set with margins. The count value "E" is set to be a value between the ranges, that is, a value obtained by counting by the counter 17 during a period t4' (t4<t4'<t5).

The latch circuits 22 and 23 latch the values of the comparators 11 and 12 when the value of the counter 17 becomes the count value "E" of the compare register 24 (Step S35). The result determination section 20 determines the channel which is in contact with the human body, based on the values latched by the latch circuits 22 and 23 (Step S36). In the case of FIG. 12, the value of the latch circuit 22 is the low level Lo and the value of the latch circuit 23 is the high level Hi, and hence it is determined that the capacitance value of the capacitor connected to the channel 2a is larger and thus the channel 2a is in contact with the human body.

Figure 12:
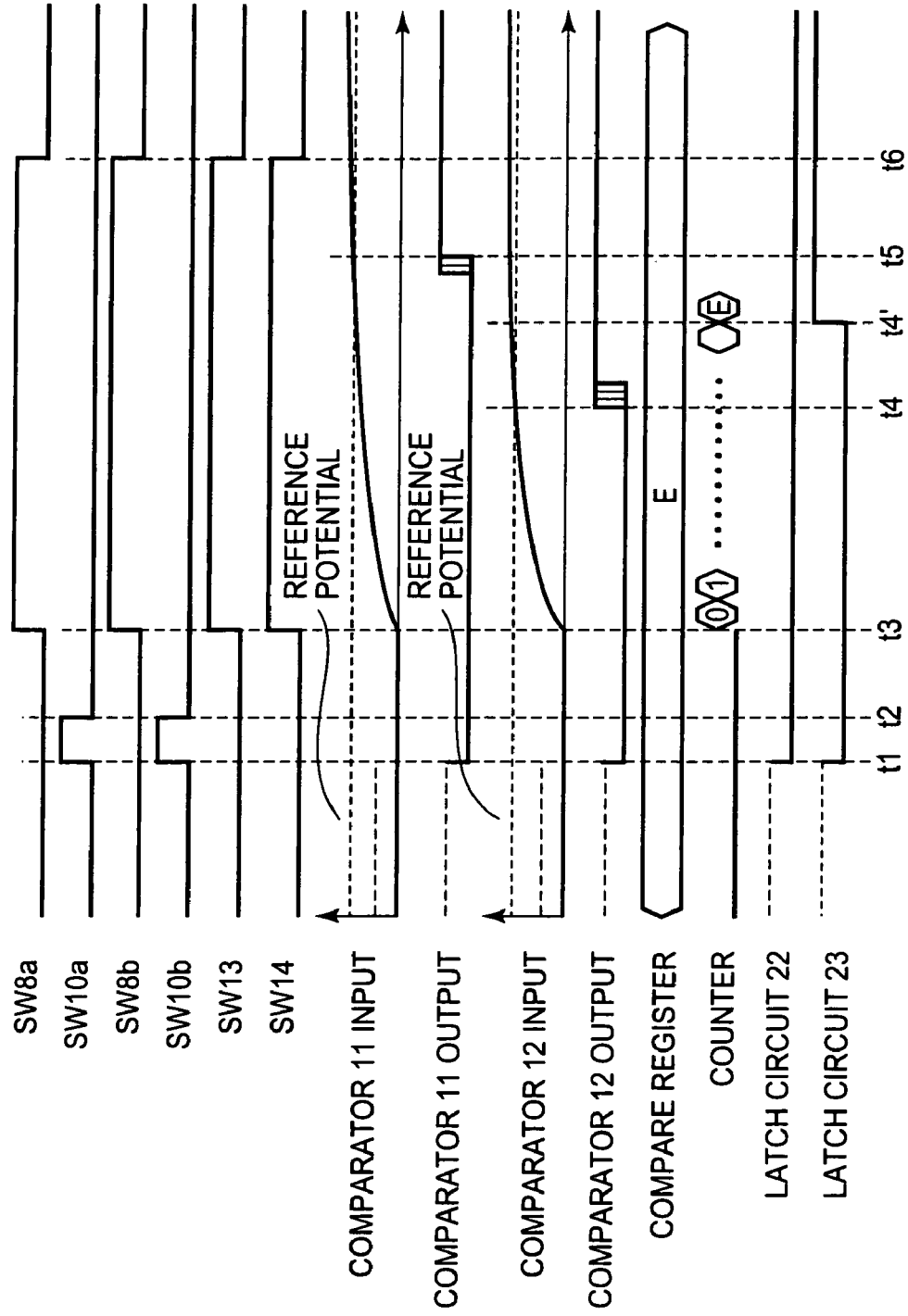
FIG. 12 is a timing chart illustrating the operation of the capacitive sensing device according to the third embodiment of the present invention.

Unlike the case of FIG. 12, even when the human body is in contact with none of the channels 2a and 2b or the human body is in contact with both the channels 2a and 2b, the result determination section 20 may make the following determination.

Value of each of latch circuits 22 and 23 is Hi . . . human body is in contact with none of channels
Value of each of latch circuits 22 and 23 is Lo . . . human body is in contact with both channels After the determination, the switches 8a, 8b, 13, and 14 are turned OFF (Step S27). The respective Steps S31 to S37 described above are repeated for the remaining channels 2c to 2n to successively determine whether or not the human body is in contact with each of the channels.

According to the third embodiment, the determination for the n channels may be made by performing the determination operation n/2 times as in the first embodiment. The outputs of the respective comparators connected to the channels selected from the n channels are obtained during the interval between the time when the potential of the channel becomes the reference potential in the case where the human body is not in contact with the channel and the time when the potential of the channel becomes the reference potential in the case where the human body is in contact with the channel. Therefore, the difference between the capacitance values of the capacitors connected to the respective channels may be determined before the potentials of all the selected channels become the reference potential, and hence higher-speed determination processing may be performed. In the first embodiment, the filters 15 and 16 are provided to remove noise from the comparators 11 and 12. However, according to the third embodiment, the values of the comparators 11 and 12 are latched by the latch circuits 22 and 23 during the period t4' indicated by the count value "E" stored in the compare register 24, and hence the filters are unnecessary.

It is apparent that the present invention is not limited to the above embodiments, but may be modified and changed without departing from the scope and spirit of the invention.

What is claimed is:

1. A capacitive sensing device, comprising:
   n sensing electrodes, wherein n is an integer equal to or larger than two;
   a selection register storing a value for selecting m sensing electrodes from the n sensing electrodes, wherein m is an integer satisfying $n \geq m \geq 2$;
   a selection section selecting the m sensing electrodes from the n sensing electrodes based on the value stored in the selection register;
   a charging and discharging control section coupled to the m sensing electrodes, wherein controlling charging and discharging capacitors connected to the m sensing electrodes is performed in parallel;
   a comparison section coupled to the m electrodes, wherein comparing a reference potential with a potential of each of the m sensing electrodes during the charging is performed by the charging and discharging control section, to generate comparison result signals associated with the m sensing electrodes; and
   a determination section coupled to the comparison section, wherein determining a difference between capacitance values of the capacitors coupled to the m sensing electrodes is based on the comparison result signals associated with the m sensing electrodes.

2. The capacitive sensing device according to claim 1, wherein the comparison section comprises m comparators,
   wherein the determination section comprises m storage sections each corresponding to the m comparators,
   wherein the m storage sections store the comparison result signals obtained from the m comparators at a predetermined timing during the charging, and
   wherein the determination section determines the difference between the capacitance values of the capacitors coupled to the m sensing electrodes based on the comparison result signals stored in the m storage sections.

3. The capacitive sensing device according to claim 2, wherein the determination section further comprises a measurement section, wherein the measurement section measures a time interval between changing points of the comparison result signals associated with the m comparators, and wherein the determination section determines the difference between the capacitance values of the capacitors connected to the m sensing electrodes based on the measured time interval and the comparison result signals stored in the m storage sections.

4. The capacitive sensing device according to claim 3, wherein, the determination section further comprises an exclusive OR calculation section, wherein the exclusive OR calculation section receives the comparison result signals from the m comparators, wherein the m storage sections store the m comparison result signals at a first changing point of an output from the exclusive OR calculation section after start of the charging, and wherein the measurement section measures a time interval between changing points of the output from the exclusive OR calculation section after the start of the charging.

5. The capacitive sensing device according to claim 2, wherein the predetermined timing comprises a timing at which at least one of the comparison result signals from the m comparators changes.

6. The capacitive sensing device according to claim 2, wherein the predetermined timing is set as a time between a charging period required for charging up to the reference potential in a case where a human body is not in contact with the m sensing electrodes and a charging period required for charging up to the reference potential in a case where the human body is in contact with at least one of the m sensing electrodes.

7. The capacitive sensing device according to claim 6, wherein, the determination section further comprises a measurement section, and wherein the m storage sections store the comparison result signals from the m comparators when a measurement time of the measurement section reaches a time indicated by the predetermined timing.

8. The capacitive sensing device according to claim 1, wherein the determination section comprises a measurement section;

wherein the measurement section measures time intervals between start of the charging and m changing points of the comparison result signals, and wherein the determination section determines the difference between the capacitance values of the capacitors coupled to the m sensing electrodes based on a difference between the measured time intervals.

9. The capacitive sensing device according to claim 8, wherein the comparison section comprises m comparators, wherein, the determination section comprises m storage sections each corresponding to the m comparators, wherein the measurement section causes corresponding one of the m storage sections to store each of the measured time intervals associated with the m changing points of the comparison result signals, and wherein the determination section determines the difference between the capacitance values of the capacitors coupled to the m sensing electrodes based on the measured time intervals stored in the m storage sections.

10. The capacitive sensing device according to claim 1, wherein the charging and discharging control section connects the m sensing electrodes with a ground potential to discharge the capacitors connected to the m sensing electrodes during a predetermined period, and connects the m sensing electrodes with a power supply potential through resistors to charge the capacitors connected to the m sensing electrodes.

11. The capacitive sensing device according to claim 1, wherein the determination section comprises a measurement section, wherein the measurement section measures a time interval between changing points of the comparison result signals associated with the m comparators, and wherein the determination section determines the difference between the capacitance values of the capacitors connected to the m sensing electrodes based on the measured time interval.

12. The capacitive sensing device according to claim 1, wherein the determination section refers to the value stored in the selection register to recognize which one of the n sensing electrodes comprises a determination target sensing electrode.

13. The capacitive sensing device according to claim 1, wherein the charging and discharging control section comprises a plurality of charging and discharging control sections, and wherein based on said selecting the m sensing electrodes from the n sensing electrodes the m sensing electrodes are connected to respective ones of the charging and discharging control sections through the selection section.

14. A capacitive sensing method of sensing capacitance values of capacitors connected to n sensing electrodes, wherein n is an integer equal to or larger than two sensing electrodes, said method comprising:

setting a value for selecting m sensing electrodes from the n sensing electrodes into a selection register, wherein m is an integer satisfying $n \geq m \geq 2$;

selecting the m sensing electrodes from the n sensing electrodes based on the value set in the selection register;

discharging capacitors connected to the m sensing electrodes, in parallel, for a predetermined period, and then charging the capacitors connected to the m sensing electrodes;

comparing a reference potential with a potential of each of the m sensing electrodes during the charging, to generate comparison results associated with the m sensing electrodes; and determining a difference between the capacitance values of the capacitors connected to the m sensing electrodes based on the comparison results associated with the m sensing electrodes, wherein the selecting, the charging and discharging, the comparing and the determining are performed n/m times.

15. The capacitive sensing method according to claim 14, wherein the determining comprises obtaining the comparison results at a predetermined timing during the charging, and determining the difference between the capacitance values of the capacitors connected to the m sensing electrodes based on the comparison results.

16. The capacitive sensing method according to claim 15, wherein the determining further comprises determining the difference between the capacitance values of the capacitors connected to the m sensing electrodes based on the comparison results and a time interval between acquisition times of the comparison results associated with the m sensing electrodes.

17. The capacitive sensing method according to claim 15, wherein the predetermined timing is set as a time between a charging period required for charging up to the reference potential in a case where a human body is not in contact with the m sensing electrodes and a charging period required for charging up to the reference potential in a case where the human body is in contact with at least one of the m sensing electrodes.

18. The capacitive sensing method according to claim 14, wherein the determining comprises:
  measuring time intervals between a start of the charging and outputs of comparison result signals; and
  determining the difference between the capacitance values of the capacitors connected to the m sensing electrodes based on a difference between the measured time intervals.

19. The capacitive sensing method according to claim 14, wherein the determining comprises determining the difference between the capacitance values of the capacitors connected to the m sensing electrodes based on a time interval between acquisition times of the comparison results associated with the m sensing electrodes.

20. The capacitive sensing method according to claim 14, wherein the determining comprises:
  referring to the value set in the selection register to recognize which one of the n sensing electrodes comprises a determination target sensing electrode.

* * * * *